United States Patent [19]

Leger et al.

[11] Patent Number: 5,568,318
[45] Date of Patent: Oct. 22, 1996

[54] METHOD AND APPARATUS FOR EFFICIENT CONCENTRATION OF LIGHT FROM LASER DIODE ARRAYS

[75] Inventors: James R. Leger, Groton; William C. Goltsos, Burlington, both of Mass.

[73] Assignee: Massachusetts Institute of Technology, Cambridge, Mass.

[21] Appl. No.: 152,585

[22] Filed: Nov. 15, 1993

Related U.S. Application Data

[62] Division of Ser. No. 809,850, Dec. 18, 1991, Pat. No. 5,333,077, which is a continuation of Ser. No. 429,417, Oct. 31, 1989, abandoned.

[51] Int. Cl.⁶ .................................................. G02B 27/10
[52] U.S. Cl. ........................... 359/618; 359/619; 359/900; 385/33
[58] Field of Search ................................. 385/31, 33, 15; 359/741, 742, 619, 565, 900, 620–626, 618

[56] References Cited

U.S. PATENT DOCUMENTS 5,031,991  7/1991  Nakatsu et al. ........................... 385/33
5,048,911  9/1991  Sang et al. ................................. 385/33

OTHER PUBLICATIONS

Cederquist et al "Computer–generated holograms for geometric transformations", Applied Optics, vol. 23, No. 18, Sep. 1984, pp. 3099–3104.

Primary Examiner—James Phan
Attorney, Agent, or Firm—Choate, Hall & Stewart

[57] ABSTRACT

A lens system for use with a linearly arrayed light beam including a first optical element for receiving and redirecting different portions of the linearly arrayed light beam to different locations on an imaginary plane so as to generate a two-dimensional pattern of light beams on the imaginary plane; and a second optical element located at the imaginary plane and aligned with the two-dimensional pattern of light beams for redirecting each of the light beams of the two-dimensional pattern of light beams to any arbitrary direction.

4 Claims, 5 Drawing Sheets

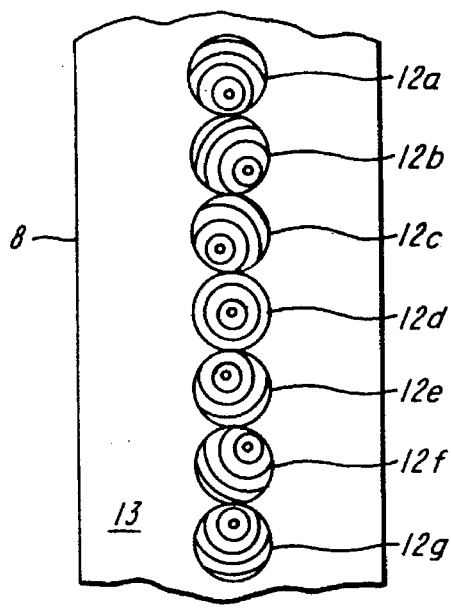
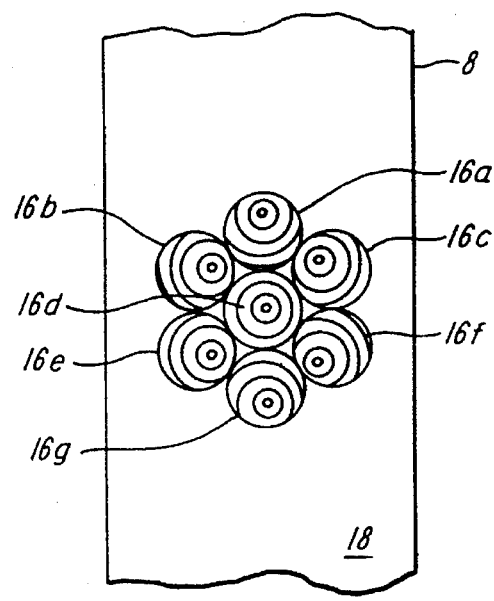
FIG. 2A   FIG. 2B
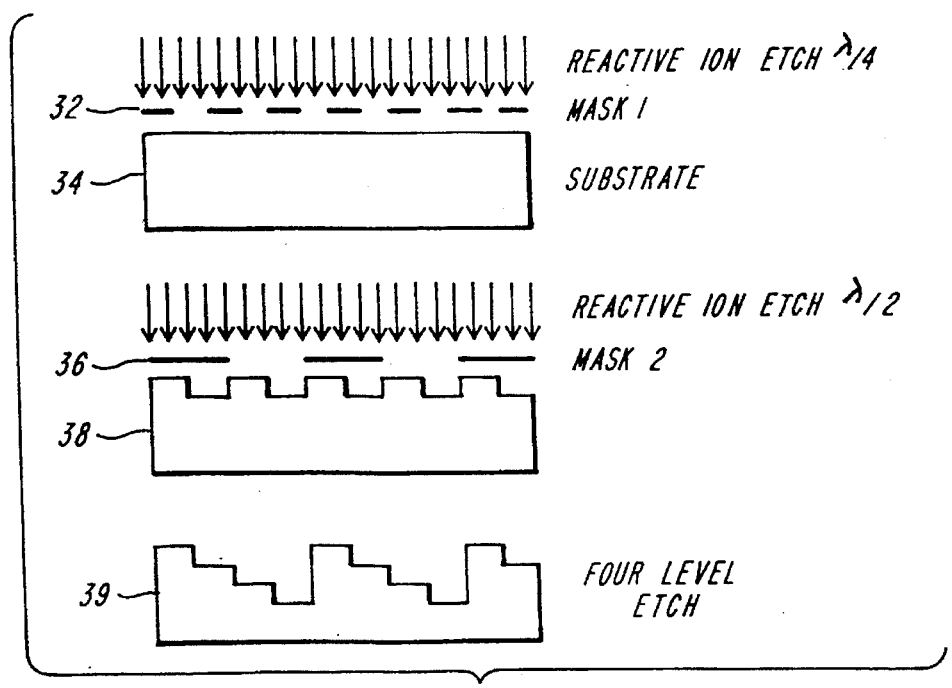
FIG. 4

METHOD AND APPARATUS FOR EFFICIENT CONCENTRATION OF LIGHT FROM LASER DIODE ARRAYS

This is a division of copending application Ser. No. 07/809,850 filed on Dec. 18, 1991, U.S. Pat. No. 5,333,077, which is a continuation of U.S. application Ser. No. 07/429,417 filed Oct. 31, 1989, now abandoned.

BACKGROUND OF THE INVENTION

The invention relates to an optical system for concentrating light from diode laser arrays.

Diode-pumped solid state lasers are of tremendous interest because of their excellent beam quality, narrow linewidth, high reliability, and potential for high efficiency. Typically, a linear diode laser array (pump array), consisting of a row of many small diode lasers, is used to pump these devices in one of two ways, either transversely or longitudinally. When used for transverse pumping, the pump array is aligned parallel to the axis of the solid state laser mode so that each of the individual beams of the many small diode lasers enters the solid state laser transversely and pumps a different lengthwise portion of the solid state laser. This technique, although allowing the addition of many pump arrays around the solid state laser, is intrinsically limited to low efficiency since pump energy is necessarily absorbed by portions of the solid state laser crystal which do not subsequently contribute energy to the lasing mode.

Longitudinal pumping involves combining all of the individual beams of the pump array in such a way as to direct all beams down the axis of the solid state laser collinearly with the lasing mode. In an idealized sense, longitudinal pumping has the advantage of being much more efficient than transfer pumping since pump energy is deposited only into the active or lasing volume of the solid state laser crystal. However, when conventional optics are used to achieve longitudinal pumping with an incoherent spatially distributed source, the size and divergence of the solid state laser mode limits the extent of the pump array which can be efficiently channelled in the active volume. Using longer pump arrays, for instance, would result in portions of the pump array having incident angles upon the laser crystal which are too large and thus not well matched to the laser mode.

To compensate for the lower efficiencies of transverse pumping, considerable effort has been spent on making large one-dimensional laser diode arrays. As a consequence of that effort, large, high power pump arrays (up to a centimeter in size) are now commercially available for transverse pumping applications. It is desirable to find a-practical way to also employ these commercially available large pump arrays for longitudinal pumping and thus achieve even higher levels of performance. In one approach to accomplishing this, fiber optics were used in an experimental set-up to combine the outputs of several linear arrays into a longitudinal pump. The fiber optic system, however, was difficult to fabricate and use. In addition, fiber coupling losses reduce the efficiency of the system.

SUMMARY OF THE INVENTION

In general, in one aspect, the invention is a lens system for use with a linearly arrayed light beam. The system includes a first optical element for receiving and redirecting different portions of the linearly arrayed light beam to different locations on an imaginary plane so as to generate a two-dimensional pattern of light beams on the imaginary plane; and a second optical element located at the imaginary plane and aligned with said two-dimensional pattern of light beams for redirecting each of the light beams of the two-dimensional pattern of light beams to any arbitrary direction.

Preferred embodiments of the invention include the following features. The first optical element and the second optical element are formed on a single substrate. The first optical element includes a linear array of first lenses, each of the first lenses oriented to receive and redirect a different portion of the linearly arrayed light beam. The second optical element includes a two-dimensional array of second lenses located at the imaginary plane and aligned with the two-dimensional pattern of light beams for redirecting and focusing the two-dimensional pattern of light beams to the focal point, which may be located at infinity. The two-dimensional array of second lenses is a hexagonally close packed array of lenses. Also, the first lenses and the second lenses are diffractive lenses. In addition, the linearly arrayed light beam is a linear array of individual light beams and the first optical element includes a linear array of first lenses, each of which is oriented to receive and redirect a different one of the individual light beams.

Also, in preferred embodiments the two-dimensional pattern is a rectangularly packed pattern and the second optical element includes a linear array of second lenses located at the imaginary plane for focusing said two-dimensional pattern of light beams to a focal point, each of said second lenses aligned to receive a corresponding row of said rectangularly packed light pattern.

In general, in another aspect, the invention is a lens system for use with two-dimensional array of light beams. The system includes a first optical element for receiving and redirecting different light beams of the two-dimensional array of light beams to different locations on an imaginary plane so as to generate a two-dimensional pattern of light beams on the imaginary plane, the two-dimensional pattern of light beams being other than a geometrically scaled version of the two-dimensional array of light beams; and a second optical element located at the imaginary plane and aligned with the two-dimensional pattern of light beams for redirecting each of the light beams of the two-dimensional pattern of light beams to any arbitrary direction.

In preferred embodiments, the first optical element includes a two-dimensional array of first lenses, each of which is oriented to receive and redirect a different one of the light beams of the two-dimensional array of light beams and the second optical element includes a two-dimensional array of second lenses located at the imaginary plane and aligned with the two-dimensional pattern of light beams for redirecting and focusing each of the light beams of the two-dimensional pattern of light beams to a focal point which may be located at infinity.

The invention supplies the key optical element for a synergistic union between larger linear diode pump arrays and longitudinal pumping of solid state lasers. In this application, it is desirable to produce as small a spot of light as possible with minimum divergence. The invention minimizes the product of the spot size and the divergence by a combination of aperture filling and geometrical transformation.

Besides solid-state laser pumping, there are other applications which can benefit from this invention. For example, coupling of light from a linear diode laser array into a mulitmode fiber requires the light to be both concentrated in a small area (to illuminate the core of the fiber) as well as have low divergence (to insure proper guiding by the fiber).

3

Other advantages and features will become apparent from the following description of the preferred embodiment and from the claims.

DESCRIPTION OF THE PREFERRED EMBODIMENT

FIGS. 2A–2B illustrate the lens arrays of FIG. 1;

FIG. 4 illustrates the fabrication steps used to produce a four level diffractive lens;

STRUCTURE AND OPERATION

Figure 1:
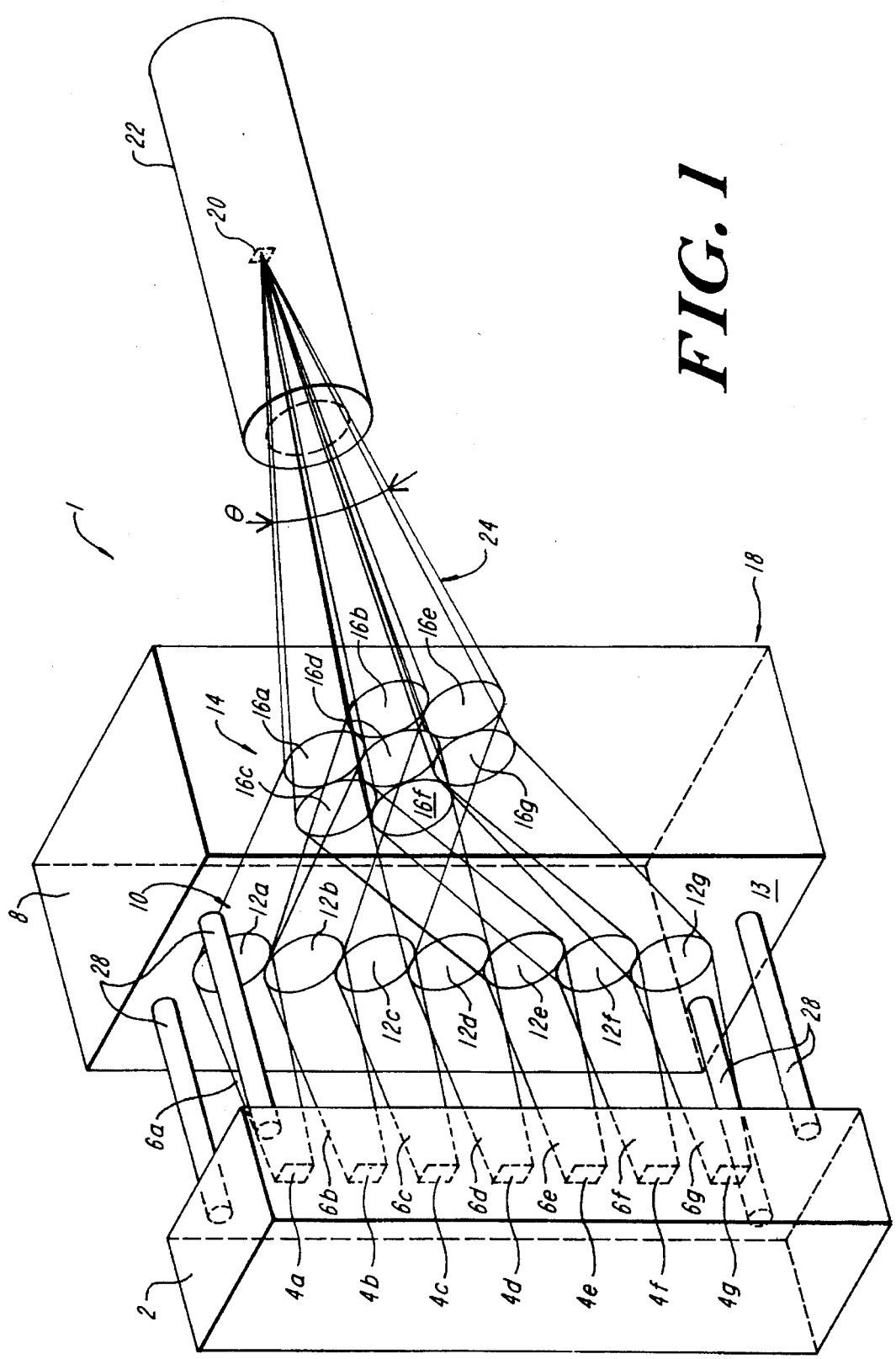
FIG. 1 is a diode pumped laser system.

Referring the FIG. 1, a diode pumped laser system 1 includes a linear laser diode array 2 consisting of a plurality of individual diode lasers 4a–g, each of which generates a corresponding laser light beam 6a–g. In alignment with diode array 2, is an optical element 8 which has a front side 13 and a back side 18 that is parallel to front side 13. On front side 13 is a linear array 10 of microlenses 12a–g (referred to generally as microlenses 12 and also shown in FIG. 2a) and on back side 18 is a two-dimensional array 14 of microlenses 16a–g (referred to generally as microlenses 16 and also shown in FIG. 2b). As used herein, microlens refers to a general phase transmittance, and may include focusing, beam tilting, aberration correction, and other beam modifying functions.

Each microlens 12 is designed and oriented so as to receive and be fully illuminated by a light beam 6 generated by a corresponding diode laser 4, to collimate that light beam 6 and then to redirect it to a corresponding microlens 16 of two-dimensional array 14. Thus, as shown in FIG. 1, microlens 16a receives a light beam from microlens 12a; microlens 16b receives a light beam from microlens 12b; etc. Each microlens 16 of two-dimensional array 14 then redirects the light beam which it receives and focuses it onto a spot 20 within a solid-state laser 22. The redirected light beams from two-dimensional array 14 form a pump beam 24 having a cone angle of θ and an optical axis which is collinear with the axis of solid state laser 22. The size of spot 22 may be designed to match the particular laser mode which is desired from solid-state laser 22.

Microlenses 12 of array 10 and microlenses 16 of array 14 serve at least two functions, namely, aperture filling and geometrically transforming the light pattern from the diode laser beams 4. As was previously stated, it is advantageous to minimize the product of the spot size and the beam divergence of the pump beam. The extent to which the invention reduces this product for a linear array of lasers will be demonstrated with the aid of FIG. 3.

Figure 3:
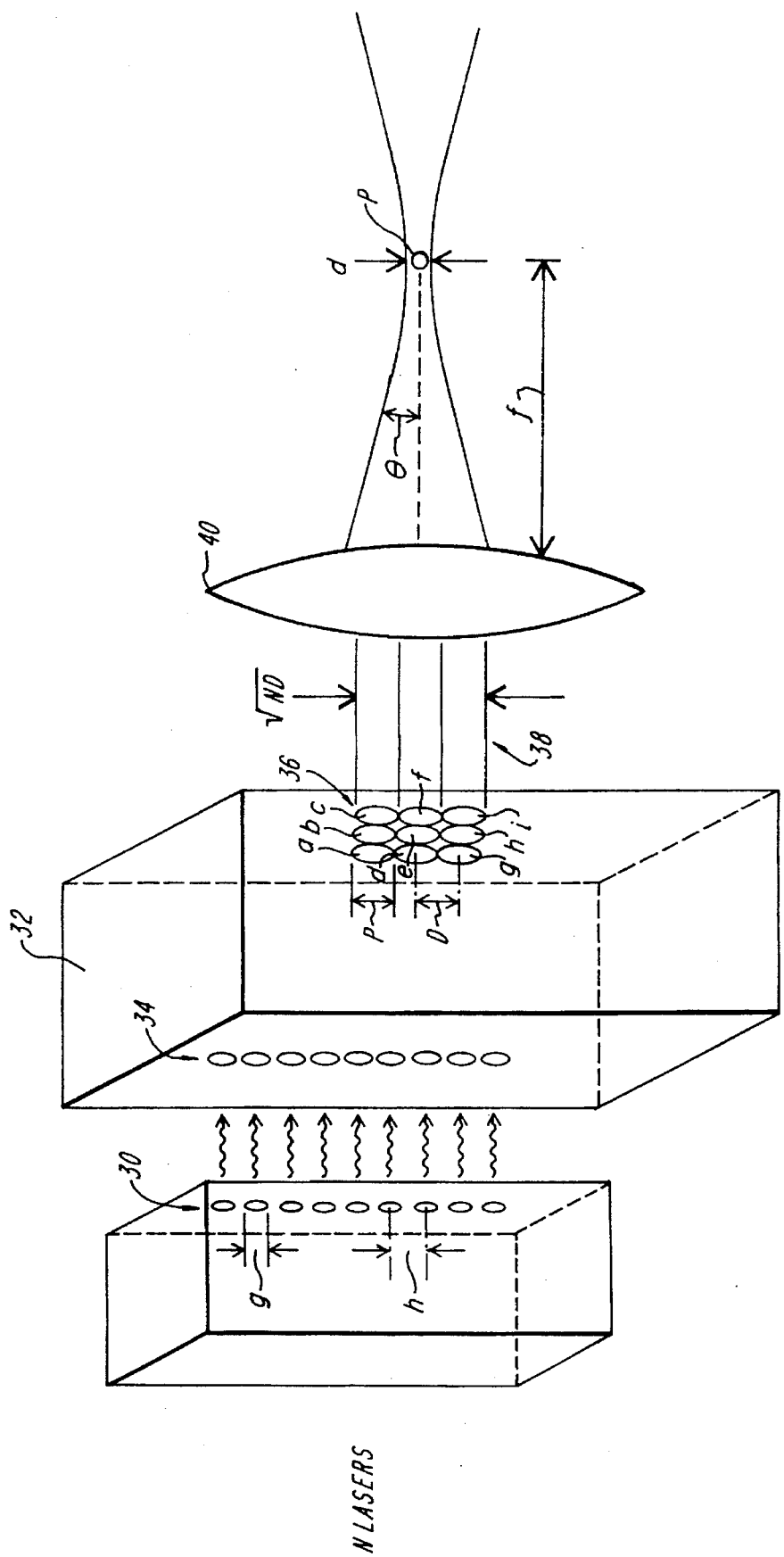
FIG. 3 illustrates the calculation of spot size and divergence of the laser using the invention.

In FIG. 3, a diode laser array 30 generates a linear array of laser beams that are received by an optical element 32 having a linear array of microlenses 34 on one side and a two-dimensional array of microlenses 36 on the other side. Linear lens array 34 receives and redirects the linearly arrayed laser beams from diode array 30 so that they form a two-dimensional pattern of light spots that is aligned with two-dimensional lens array 36. Two-dimensional lens array 36 then redirects the light which it receives and produces a two-dimensional array of collimated parallel light beams 38 (i.e., they are focused to a point at infinity). Finally, an external refractive lens 40 focuses parallel light beams 38 to a focal point P.

The spot size d at focal point P of lens 40 is given by $$d = 2\lambda f/P, \quad (1)$$

where $\lambda$ is a wavelength of light, f is the focal length of the lens 40, and P is the diameter of one of the beams collimated by its corresponding microlens in two-dimensional lens array 36. The maximum divergence $\Theta_{max}$ is approximately given by $$\Theta_{max} \approx \frac{D\sqrt{N}}{2f} \quad (2)$$

where N is the number of lasers in the laser array 30 and D is the spacing of the microlenses in two-dimensional lens array 36. The product of the spot size and the divergence is then given by $$\Theta_{max} d = \frac{D\lambda \sqrt{N}}{P} \quad (3)$$

This number is minimized by making P as large as possible. The minimum value is obtained when the light from one collimated beam (for example the beam coming from microlens 36e of two-dimensional lens array 36) abuts adjacent beams (corresponding to microlenses 36b, 36d, 36f, and 36h in this example). In this case, P=D and the minimum value for $\Theta_{max} d$ is given by $$\Theta_{max} d = \lambda \sqrt{N} \quad (4)$$

This procedure (called aperture filling) is performed by placing the microlenses of two-dimensional array 36 as close together as possible, and choosing the tilt angle and aperture size of microlenses of linear lens array 34 to fully illuminate the corresponding microlenses of array 36.

The equivalent $\Theta_{max} d$ product for a linear diode array 30 without the invention is given by $$\{\Theta_{max} d\}_{original} = N\lambda \frac{h}{g}, \quad (5)$$

where h is the spacing between lasers in laser array 30 and g is the width of a single lasing aperture. Comparing Eq. 4 and Eq. 5 shows the $\Theta_{max} d$ product using the invention has been reduced by a factor of $(h\overline{N})/g$. A typical one-dimensional CW laser array consists of N=200 lasers with a fill factor g/h of 20%. The invention results in a reduction of the $\Theta_{max} d$ product by a factor of 70, resulting in a much more tightly focused, more highly collimated beam.

In the described embodiment, the microlenses 12 and 16 of FIG. 1 are formed on a single substrate by using the techniques commonly used for binary optics and diffractive lenses. The transmittance of each lens in array 10 can be considered to be a product of an on-axis lensing function:

$$t_{1i}(x, y) = \exp\left[-j\frac{2\pi}{\lambda} \sqrt{x^2 + y^2 + f_i^2}\right] \quad (6)$$

and a prism:

$$t_{2i}(x, y) = \exp\left[\frac{-j2\pi}{\lambda} (x \cos\theta_i + y \cos\phi_i)\right] \quad (7)$$

where the z-axis is perpendicular to the plane of lens 12, i is an index identifying the lens, $f_i$ is the focal length of the $i^{th}$ lens, $\theta_i$ and $\phi_i$ are the directions with respect to the x and y axes, respectively, of the plane wave propagating from the $i^{th}$ lens and $\lambda$ is the wavelength of light beams 6. For each lens 12, $\theta_i$ and $\phi_i$ depend upon the relative location of the corresponding receiving lens 16 in two-dimensional lens array 14 and $f_i$ depends upon the divergence of the diode laser 4 and the spacing between lasers.

The lens transmittance for each lens defines a phase profile for that lens. With this equation, a diffractive lens is constructed based upon diffractive optics fabrication techniques such as are described in U.S. patent application Ser. No. 099,307 entitled "High Efficiency Multi-level Diffractive Optical Elements" by G Swanson and W. Veldkamp or in U.S. Pat. No. 4,813,762 by James R. Leger et al., both of which are incorporated herein by reference.

In general, the profile for the diffractive microlens is generated by subtracting integral numbers of wavelengths from the lens transmittance function so that the resulting phase function is constrained to lie between 0 and $2\pi$. Quantized phase levels are then used to approximate the resulting phase profile. The boundaries between the etch levels of a binary lens (two phase levels) are given by the locus of points (x,y) which satisfy the equation:

$$\left[\frac{2\pi}{\lambda}\sqrt{x^2+y^2+f_i^2}\right]+\frac{2\pi}{\lambda}[x\cos\theta_i+y\cos\phi_i]=n\pi \quad (8)$$

for various values of the integer n. These points form Fresnel zones which are off-centered circles.

The diffraction efficiency of the simple binary diffractive lens in the above equation is 40.5%. This efficiency can be increased by etching multiple levels to better approximate the lens transmittance equation.

Equation (2) can be modified to apply to any number of masks (P). The $P_{th}$ mask is defined by the equation:

$$\left[\frac{2\pi}{\lambda}\sqrt{x^2+y^2+f_i^2}\right]+\frac{2\pi}{\lambda}[x\cos\theta_i+y\cos\phi_i]=\frac{2n\pi}{2^p} \quad (9)$$

where $p=1,2,\ldots P$.

Of course, lens array 10 can also be used to correct for laser beam aberrations, in which case the transmittance function will be slightly different from that described above. In particular, astigmatism can be eliminated by using anamorphic lenses.

As noted earlier, lenses 16a–f in two-dimensional array 14 redirect the light beams from lens array 10 and focus them to spot 20. In addition to serving this function, lenses 16a–f are also chosen to remove any spherical curvature from beam propagation between front side 13 and back side 18. The location and size of spot 20 can be selected to maximize the overlap with the solid state laser mode. For a high absorption crystal, it is useful to focus the beams onto spot 20 inside laser 22, as shown. For a low absorption crystal, it is better to focus the spot more towards infinity (i.e., generate a collimated beam) so that the divergence, e, is minimized and absorption can take place over the entire length of the crystal.

The diffractive microlens arrays described here can be fabricated completely by mask-and-etch techniques used in producing integrated electronic circuits. High quality aspheric lenses of arbitrary size and shape can be fabricated with this method. Large arrays of lenses can be produced as easily as single lenses. In addition, master molds can be made by metalizing these elements and plastic replicas can be manufactured inexpensively by conventional embossing techniques.

Fabrication takes place in three stages: (i) computer-aided design and generation of a master mask, (ii) transferring the mask pattern onto the lens substrate using photolithography, and (iii) etching the pattern into the substrate material. The P master masks are produced corresponding to the P etching steps of the $m=2^P$ level lens. The master masks are replicated by vacuum-contact photolithography onto thin chromium-coated glass plates (flex masks). These flex masks are used to expose a layer of photoresist on a chromium coated quartz substrate by vacuum contact photolithography. The mask with the smallest features (i.e., $p=P$) is printed first. After photoresist development the exposed chromium is wet-etched, leaving a patterned etch stop 32 on the substrate 34 shown diagrammatically in FIG. 4. The substrate is reactive-ion etched to a depth corresponding to a phase retardation of $\lambda/m$ (where $\lambda$ is the wave-length of light) using $CHF_3$, after which the etched substrate 38 is recoated with photoresist, and the second mask 36 ($p=P-1$) is aligned to the etched pattern on the substrate. After etching to remove exposed chromium, the substrate is reactive-ion etched to a depth corresponding to a phase retardation of $2\lambda/m$. This process is repeated for all P masks. The resulting m-level etch profile 39 has a theoretical diffraction efficiency of:

$$\left|\frac{\sin(\pi/m)}{\pi/m}\right|^2.$$

High diffraction efficiencies can be obtained by using a large number of etch levels. For example, 16 levels corresponding to 4 etches) produces a diffraction efficiency of 98.7%.

As illustrated in FIG. 1, spacers 28 are used to maintain laser diode array 2 separated from and in registration with optical element 8. (Note that the figures are not drawn to scale and thus, the relative sizes and separations of elements may be exaggerated.) Spacers 28 achieve a uniform separation between array 2 and optical element 8 that is accurate to at least within the depth of focus of microlenses 12. Spacers 28 may be formed during the above-described etching process or they may be part of a separate component that is inserted between array 2 and optical element 8 during assembly.

Figure 5:
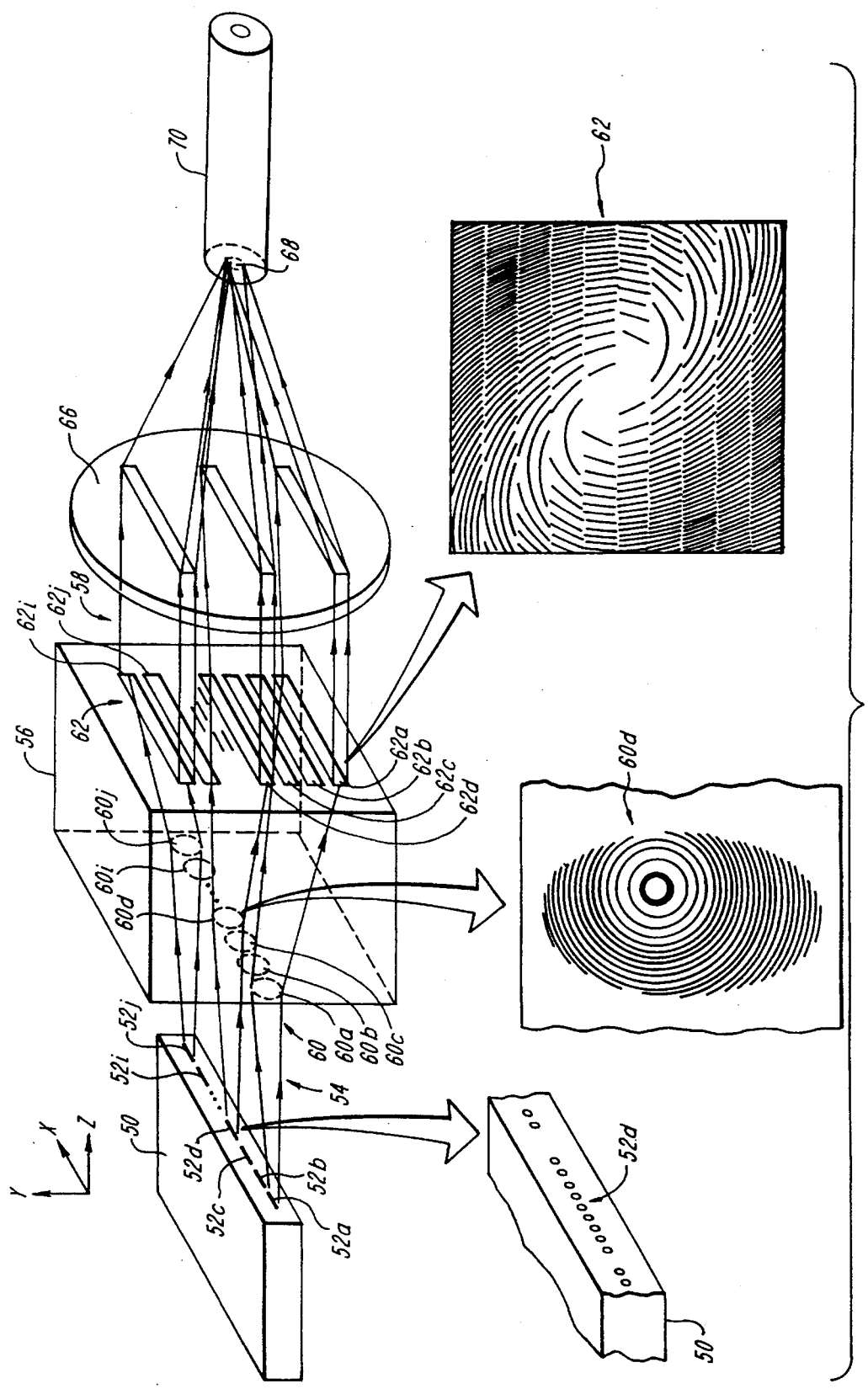
FIG. 5 is another diode pumped laser system.

Although a particular geometrical mapping from 1-D to 2-D has been described, other mappings may, of course, be used depending upon the requirements of the pumping system. For example, FIG. 5 illustrates a geometrical mapping that is used with a high power continuous wave (CW) laser diode array 50 consisting of a sequence of ten smaller laser diode arrays 52a–j (referred to generally as banks 52). Each bank 52 consists of a 100 micron long group of ten diode lasers and is laterally spaced from the next bank 52 by 400 microns, a separation distance that is sufficiently large to provide adequate heat dissipation during CW operation. Thus, the overall length of laser diode array 50 is about 5000 microns.

Laser diode array 50 transmits a linear array of light beams 54 to an optical element 56 which then transforms them into a two-dimensional array of light beams 58. Optical element 56 has a front side on which is formed a linear array 60 of diffractive lenses 60a–j (one of which is illustrated in the enlarged view) and it has a back side on which is formed a two-dimensional array 62 of diffractive lenses 62a–j (which is also depicted in the enlarged view). Each lens of linear array 60 receives a set of 10 light beams from a corresponding bank 52 and then redirects, magnifies and focuses that set of light beams onto a corresponding lens of two-dimensional array 62. Thus, for example, lens 60d of linear array 60 receives the ten diode light beams from bank 52d and redirects them onto lens 62d of two-dimensional array 62.

The individual lenses in linear array 60 are designed so that they direct the pattern of light beams from the corresponding ten laser diode banks 52 to regions on the back side of optical element 56 that have the same x-axis coordinates but different y-axis coordinates, thereby producing a two-dimensional pattern of light beams that is aligned with two-dimensional array 62. In this embodiment, a 50:1 magnification is used so that the size of the two-dimensional pattern is about 5000 microns by 5000 microns. Each lens of two-dimensional array 62 then redirects the beams which it receives so that all the beams propagate parallel to the optical axis. Thus, the two-dimensional array of light beams 58 exiting from optical element 56 represents a virtual two-dimensional source of collimated light with a fill factor close to 100%. In this manner, optical element 56 converts a high power commercially available one-dimensional laser source into a two-dimensional source with a high fill factor.

Since the two-dimensional array of light beams 58 that exits from optical element 56 is focused at infinity, a mode matching lens 66 is then be used to focus the light onto a spot 68 along the axis of a solid state laser 70. Of course, this focusing could have been accomplished by two-dimensional lens array 62. However, by not performing the focusing function with two-dimensional lens array 62, the resulting optical element 56 can be used in a wider variety of applications by merely using different mode matching lenses.

Other embodiments are within the following claims. For example, linear diode laser array 2 (see FIG. 1) may generate a linearly arrayed light beam that comprises a single continuous beam rather than a linear array of individual beams as described above. (A broad area laser, for example, generates such a beam.) In that case, each microlens of array 10 would receive a corresponding different portion of the linearly arrayed light beam and redirect it to a corresponding lens of two-dimensional lens array 14.

Figure 6:
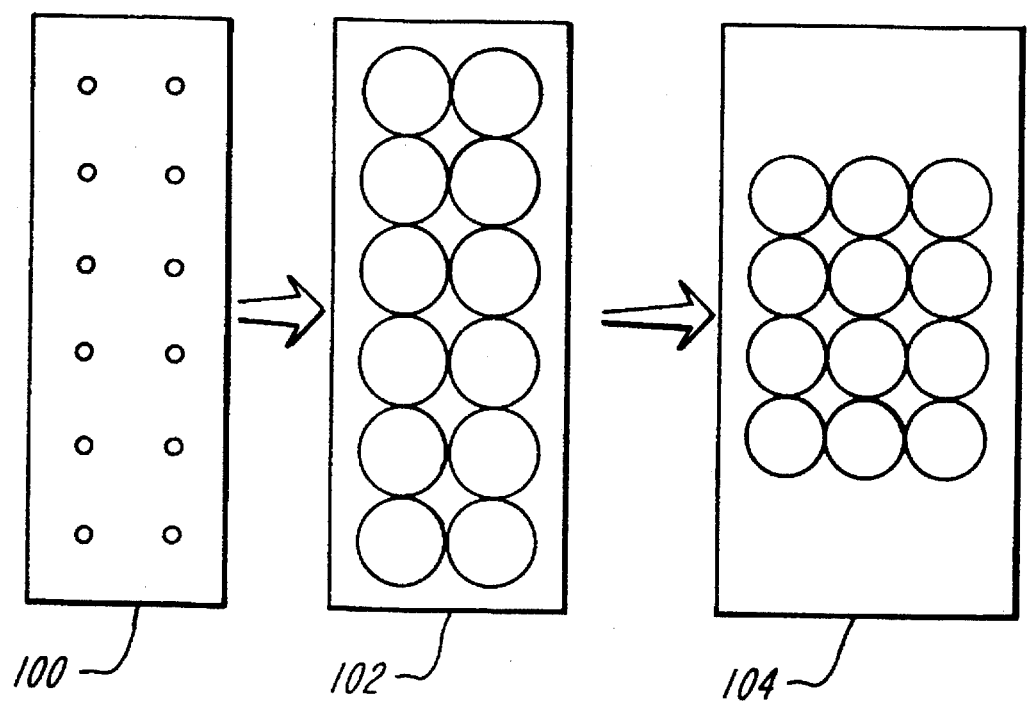
FIG. 6 shows the elements of an optical system for concentrating the light from a two-dimensional laser diode array.

In another example, shown diagrammatically in FIG. 6, the invention can be adapted to process a two-dimensional array of light beams in accordance with the principles described above. In such a system, a first two-dimensional array of lenses 100 is aligned with a two-dimensional array of lasers 102 so that each of the lenses of first lens array 100 receives and redirects a light beam from a different one of the lasers to form a different two-dimensional pattern on an imaginary plane. A second two-dimensional array of lenses 104 located on the imaginary plane is aligned so that each of the lenses of second array 104 receives a different light beam of the two-dimensional pattern and redirects and focuses that light beam to a common focal point.

In addition, although the described embodiment employed diffractive lenses, other lenses could be used such as, for example, refractive lenses or reflective mirrors.

What is claimed is:

1. A method for directing light into an optical fiber using a light beam having a spatial cross-sectional distribution which is extended predominantly in one direction, the method comprising:

receiving the light beam;

redirecting different portions of the received light beam to different locations on an imaginary plane wherein at least two portions of the light beam are directed along two nonparallel paths so as to generate a two-dimensional pattern of light on the imaginary plane;

redirecting portions of said two-dimensional pattern of light to a point along an axis of the optical fiber.

2. A method for directing light into an optical fiber using a linear array of individual light beams, the method comprising:

receiving the linear array of individual light beams;

redirecting each individual light beam to different locations on an imaginary plane wherein at least two light beams of the linear array of individual light beams are directed along two non-parallel paths so as to generate a two-dimensional pattern of light beams on the imaginary plane;

redirecting the light beams of the two-dimensional pattern of light beams to a point along an axis of the optical fiber.

3. A method for directing light into an optical fiber using a two-dimensional light beam, the method comprising:

receiving the two-dimensional light beam;

redirecting different portions of the received two-dimensional light beam to different locations on an imaginary plane wherein at least two portions of the two-dimensional light beam are directed along two non-parallel paths so as to generate a two-dimensional pattern of light on the imaginary plane, the two-dimensional pattern of light being a non-image of the two-dimensional light beam;

redirecting portions of said two-dimensional pattern of light to a point along an axis of the optical fiber.

4. A method for directing light into an optical fiber using a two-dimensional array of individual light beams, the method comprising:

receiving the two-dimensional array of individual light beams;

redirecting each of the received light beams of said two-dimensional array of individual light beams to different locations on an imaginary plane wherein at least two light beams of the two-dimensional array of individual light beams are directed along two nonparallel paths so as to generate a two-dimensional pattern of light beams on the imaginary plane, the two-dimensional pattern of light beams being a non-image of the two-dimensional array of light beams;

redirecting the light beams of said two-dimensional pattern of light beams to a point along an axis of the optical fiber.

* * * * *

UNITED STATES PATENT AND TRADEMARK OFFICE
CERTIFICATE OF CORRECTION

PATENT NO. : 5,568,318
DATED : October 22, 1996
INVENTOR(S) : James R. Leger, et. al.

It is certified that error appears in the above-identified patent and that said Letters Patent is hereby corrected as shown below:

Column 1, after the title and before the paragraph entitled "Background of the Invention", please insert the following statement: -- This invention was made with government support under Contract Number F19628-85-C-0002 awarded by the U.S. Air Force. The government has certain rights in the invention. --

Signed and Sealed this

Twenty-third Day of December, 1997

Attest:

BRUCE LEHMAN

*Attesting Officer*  *Commissioner of Patents and Trademarks*